United States Patent
Kopmeiners et al.

Patent Number: 5,917,865
Date of Patent: Jun. 29, 1999

[54] DIGITAL AUTOMATIC GAIN CONTROL EMPLOYING TWO-STAGE GAIN-DETERMINATION PROCESS

[75] Inventors: Robert John Kopmeiners, Hengelo; Hans van Driest, Bilthoven, both of Netherlands

[73] Assignee: Lucent Technologies, Inc., Murray Hill, N.J.

[21] Appl. No.: 08/777,654

[22] Filed: Dec. 31, 1996

[51] Int. Cl.⁶ ................................. H04B 1/16; H03L 5/00
[52] U.S. Cl. .................... 375/345; 455/239.1; 455/245.1
[58] Field of Search ............................ 375/245; 455/217, 455/232.1, 234.1, 239.1, 245.1, 250.1, 254; 341/139, 142; 327/306, 331, 332

[56] References Cited

U.S. PATENT DOCUMENTS

| | | | |
|---|---|---|---|
| 4,499,586 | 2/1985 | Cafarella et al. | 375/345 |
| 4,785,418 | 11/1988 | Pearce et al. | 364/715.011 |
| 5,134,631 | 7/1992 | Kingston et al. | 375/200 |
| 5,563,916 | 10/1996 | Scarpa | 375/345 |
| 5,694,436 | 12/1997 | Huang et al. | 375/345 |

*Primary Examiner*—Stephen Chin
*Assistant Examiner*—Jeffrey W. Gluck

[57] ABSTRACT

For use in an automatic gain control that receives a digital signal from a digital circuit having a given dynamic range and develops therefrom a gain signal to be applied to a variable gain amplifier, an analyzing circuit for, and method of, determining a magnitude of the gain signal. The analyzing circuit includes: (1) a peak sampling subcircuit that determines an average peak value of the digital signal over variable periods of time and (2) a gain signal adjustment subcircuit, coupled to the peak sampling subcircuit, that operates in a selected one of: (a) a search mode in which the gain signal adjustment subcircuit decreases the periods of time and adjusts the gain signal at a first rate until the average peak value falls within the dynamic range of the digital circuit and (b) a direct step mode in which the gain signal adjustment subcircuit increases the periods of time and adjusts the gain signal at a second rate as a function of a deviation of the average peak value from a target average peak value, the first rate being faster than the second rate, the analyzing circuit thereby applying a two-stage gain determination process to the digital signal to approach the target average peak value.

27 Claims, 5 Drawing Sheets

DIGITAL AUTOMATIC GAIN CONTROL EMPLOYING TWO-STAGE GAIN-DETERMINATION PROCESS

TECHNICAL FIELD OF THE INVENTION

The present invention is directed, in general, to automatic gain controls and, more specifically, to a digital automatic gain control that employs at least a two-stage (coarse and fine) process to determine the proper gain to be applied.

BACKGROUND OF THE INVENTION

RF receivers incorporating analog or digital automatic gain controllers (AGC) are well-known and widely used. Although the applications in which RF receivers with AGC are used are too numerous to describe in detail, one increasingly popular application is in the field of wireless computer systems, such as wireless LANs.

In a typical wireless computer network environment, the "backbone" of the LAN takes the form of one or more central servers that communicate with a number of network base stations, or access points ("APs"), through a hard-wired connection. Each access point (AP) includes an RF receiver/transmitter for communicating with at least one roaming mobile station ("MS"), which also incorporates an RF receiver/transmitter. These RF receivers often employ either direct sequence spread spectrum ("DSSS") or frequency-hopping spread spectrum ("FHSS") techniques to communicate between roaming mobile stations and network access points. The mobile station may be a point-of-sale terminal (e.g., an electronic cash register), a bar code reader or other scanning device, or a notepad, desktop or laptop computer.

Each MS establishes a communication link with an AP by scanning the ISM (industrial, scientific, medical) band to find an available AP. Once a reliable link is established, the MS interacts with other mobile stations, network servers, or a combination thereof. This allows the user of the MS to move freely in the office, factory, hospital or other facility where the wireless LAN is based, without the length of a hard-wired connection to the LAN limiting the MS. This communication link is maintained even if the MS moves out of range of its current AP. When the MS senses that the communication link with the current AP is unacceptably weak, the MS initiates a scanning process that ultimately results in a "handover" that establishes a new communication link with a second AP. Ideally, this handover is "seamless" to the user. That is, the handover is performed from one AP to the second AP without requiring user input and without interrupting an on-going task in the MS.

The RF receiver in the mobile station typically incorporates an automatic gain control (AGC) circuit that adjusts the strength of the received signal to an optimum level within the dynamic range of various signal processing components in the received signal path. The AGC circuit initially helps to bring a newly received signal into the dynamic range of the receiver when the MS is first establishing a communication link with an AP. Thereafter, the AGC circuit continually adjusts the receiver gain as data packets are received from the AP in order to compensate for fluctuations in received signal strength associated with fading, interference, periods of "silence" between data frames, etc.

The "settling" time of an AGC is the time required by the AGC to bring the received signal to an optimum level within the dynamic range of the RF receiver. During the settling time, the RF receiver is generally unable to perform other functions, such as training, symbol detection, etc. This means that the settling time tends to increase the "overhead" of the RF receiver. Since the RF receiver is part of a high-speed communication link, it is extremely important to minimize the settling time of the AGC.

A wide variety of AGC systems are known in the prior art. These AGC systems include both analog and digital designs, and vary considerably according to speed, accuracy, cost and complexity. Analog systems frequently operate at higher speeds (i.e., very short settling times) than corresponding digital systems. However, analog systems are generally more complex, and therefore more costly to implement, than equivalent digital designs.

Therefore, there is a need in RF receiver technology for improved systems and methods of automatic gain control that provide very high-speed adjustment of RF receiver gain. In particular, there is a need for improved digital AGCs for use in digital RF receivers that rapidly bring the strength of a received input signal to a desired target level in the dynamic range of the RF receiver.

SUMMARY OF THE INVENTION

To address the above-discussed deficiencies of the prior art, the present invention provides, for use in an automatic gain control that receives a digitized signal from a digital circuit having a given dynamic range and develops therefrom a gain signal to be applied to a variable gain amplifier, an analyzing circuit for, and method of, determining the magnitude at which the gain signal should be set.

The analyzing circuit includes: (1) a peak sampling subcircuit that samples peak values of the digital signal over variable periods of time and (2) a gain signal adjustment subcircuit, coupled to the peak sampling subcircuit, that operates in a selected one of: (a) a search mode in which the gain signal adjustment subcircuit adjusts the variable periods of time to a first interval length and adjusts the gain signal at a first rate until a first one of the sampled peak values falls within the dynamic range of the digital circuit and (b) a direct step mode in which the gain signal adjustment subcircuit adjusts the variable the periods of time to a second interval length and adjusts the gain signal at a second rate as a function of a deviation of an average of a plurality of sampled peak values from a target average peak value, the analyzing circuit thereby applying a two-stage gain determination process to the digital signal to approach the target average peak value.

The present invention therefore introduces an automatic gain control that operates in two modes (or stages) to determine the proper gain signal level. The first mode (the search mode) is characterized by relatively fast, broad adjustments of the gain signal until it comes to within the dynamic range of the digital circuit (perhaps an analog to digital converter). Once the gain signal is within the dynamic range, the second mode (the direct step mode) is entered. The direct step mode is characterized by slower, typically more delicate, adjustments to the gain signal that are an averaged function of its deviation from the desired target average peak value.

In one embodiment of the present invention, in the search mode, the gain signal adjustment subcircuit adjusts the gain signal as a function of the dynamic range of the digital circuit. In a more specific embodiment, the gain signal adjustment subcircuit adjusts the gain signal by an amount that at most approximates the dynamic range of the digital circuit. For example, if the dynamic range of the digital circuit is 20 dB, the gain signal is adjusted (either downward or upward) in steps of approximately 20 dB.

In one embodiment of the present invention, in the search mode, the gain signal adjustment subcircuit adjusts the gain signal by increasing the gain signal by a given amount until the sampled peak value rises above the dynamic range of the digital circuit, the gain signal adjustment subcircuit then decreasing the gain signal by a fraction of the given amount to cause the sampled peak value to fall within the dynamic range. Alternatively, the gain signal adjustment circuit could decrease the gain signal until it falls below the dynamic range and then increase it to cause it to fall within the dynamic range. Other alternatives, such as binary division methods wherein the dynamic range is approached from both above and below, are also possible.

In one embodiment of the present invention, in the direct step mode, the gain signal adjustment subcircuit adjusts the second interval length to encompass a varying number of sampled peak values of the digital signal. By sampling and averaging more than one peak, greater stability is attained.

In one embodiment of the present invention, in the direct step mode, the gain signal adjustment subcircuit adjusts the gain signal according to a monotone function representing a gain function of the variable gain amplifier. In another embodiment of the present invention, the gain signal adjustment subcircuit adjusts the gain signal according to a gain function of the variable gain amplifier stored in a look-up table associated with the analyzing circuit. In still another embodiment of the present invention, in the direct step mode, the gain signal adjustment subcircuit continually adjusts the gain signal to compensate for a mismatch of the gain function stored in the look-up table and the actual gain function of the variable gain amplifier.

In one embodiment of the present invention, in the direct step mode, the gain signal adjustment subcircuit continually adjusts the gain signal to compensate for rounding errors and to compensate for small signal fluctuations. Thus, the circuit of the present invention may continue to operate, once the proper gain signal is initially attained, to provide continuing adjustments to the gain signal to compensate for errors due to granularity inherent in the digital circuit, for example.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
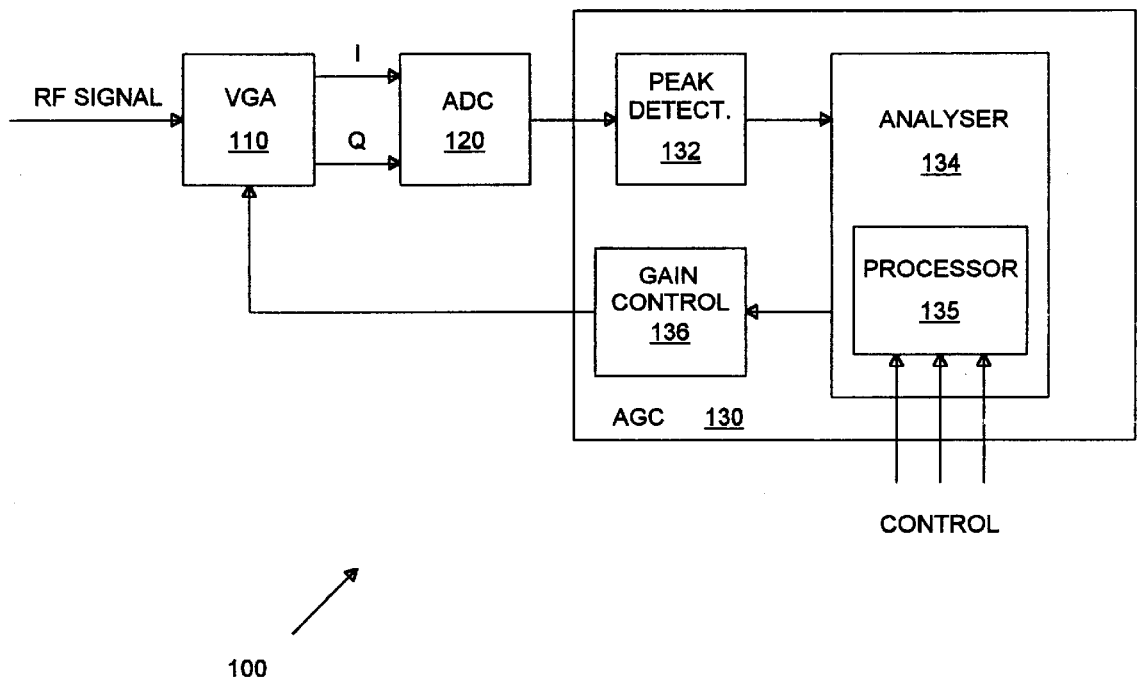
FIG. 1 illustrates a block diagram of an RF receiver in accordance with the present invention.

FIG. 1 depicts block diagram 100 of RF receiver 100 in accordance with the present invention. RF receiver 100 comprises variable gain amplifier (VGA) 110, analog-to-digital converter (ADC) 120 and automatic gain control (AGC) circuit 130. AGC circuit 130 includes peak detector 132, analyzer circuit 134 and gain control 136. The output of AGC circuit 130 is a gain value which controls the variable gain output of VGA 110.

VGA 110 receives an RF signal from the receiver front end (not shown). Although VGA 110 is represented as a single unit in FIG. 1, it should be understood that VGA 110 may represent multiple stages in the receiver signal processing path. VGA 110 splits the input signal into quadrature baseband signals consisting of a real component, I, and an imaginary component, Q. The gain factor applied by VGA 110 to the input signal may be controlled by either a digital or an analog signal from AGC circuit 130.

ADC 120 contains separate analog-to-digital converters for converting the real component, I, and the imaginary component, Q, of the output quadrature baseband signals produced by VGA 110. The resolution of ADC 120 depends on the number of bits in each of the digital outputs for the real and imaginary outputs. The number of bits in the real and imaginary outputs of ADC 120 also determines the dynamic range of ADC 120. The greater the dynamic range of ADC 120, the faster the present invention can match the gain of VGA 110 to the level needed to amplify the peak level of the received signal to an optimum target signal level in the dynamic range of ADC 120.

Peak detector 132 in AGC 130 detects the peak signal level during a sampling interval, T, using a peak-hold function. The peak signal level in interval T is the maximum absolute value of the real and imaginary outputs of ADC 120. The size of sampling interval T may or may not be set by an external control function (not shown). In one embodiment of the present invention, peak detector 132 may be implemented in an analog design that allows infinite variation of interval T between a maximum length and a minimum length. In an alternate embodiment of the present invention, the length of the sampling interval T is determined by a programmable number of cycles of an underlying clock signal. The interval T may therefore be programmed to be any one of a number of fixed length windows, varying from a minimum sized window (e.g., 20 µsec.) to a maximum sized window (e.g., 200 µsec.), each of which is a multiple of the underlying clock cycle length.

Analyzer 134 includes processor 135, which receives external control signals from the external control function. These control signals may initiate the scanning process when RF receiver 100 is looking for a new signal. These control signals may also determine the target signal level to which the received signal level must be adjusted. Analyzer 134 examines the peak signal measured by peak detector 132 and adjusts gain control 136 according to an algorithm to be explained below. Gain control 136 translates the digital control signal received from analyzer 134 to an appropriate gain setting for VGA 110. As previously mentioned, the output of gain control 136 may be an analog or a digital control signal, depending upon implementation.

Numerous microprocessor-controlled automatic gain control circuits similar to the one described above are disclosed in the prior art, including U.S. Pat. No. 4,499,586 to Cafarella et al. and U.S. Pat. No. 5,134,631 to Kingston et al. The gain control devices disclosed in the Kingston and Cafarella references are hereby incorporated by reference in the present disclosure as if fully set forth herein.

Figure 2A:
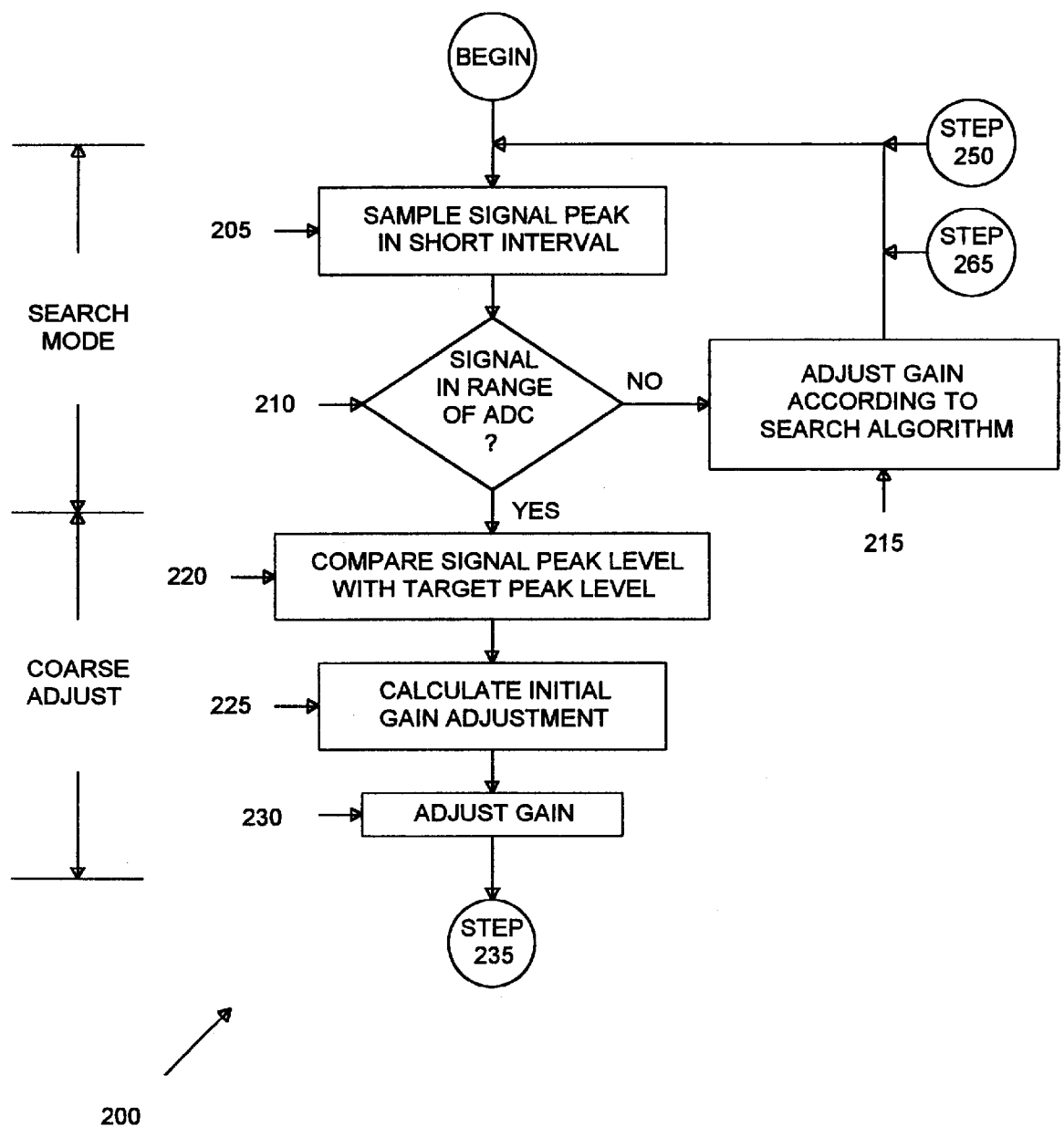
FIGS. 2A and 2B illustrate a method of adjusting the gain of a digital AGC in accordance with the present invention.
Figure 2B:
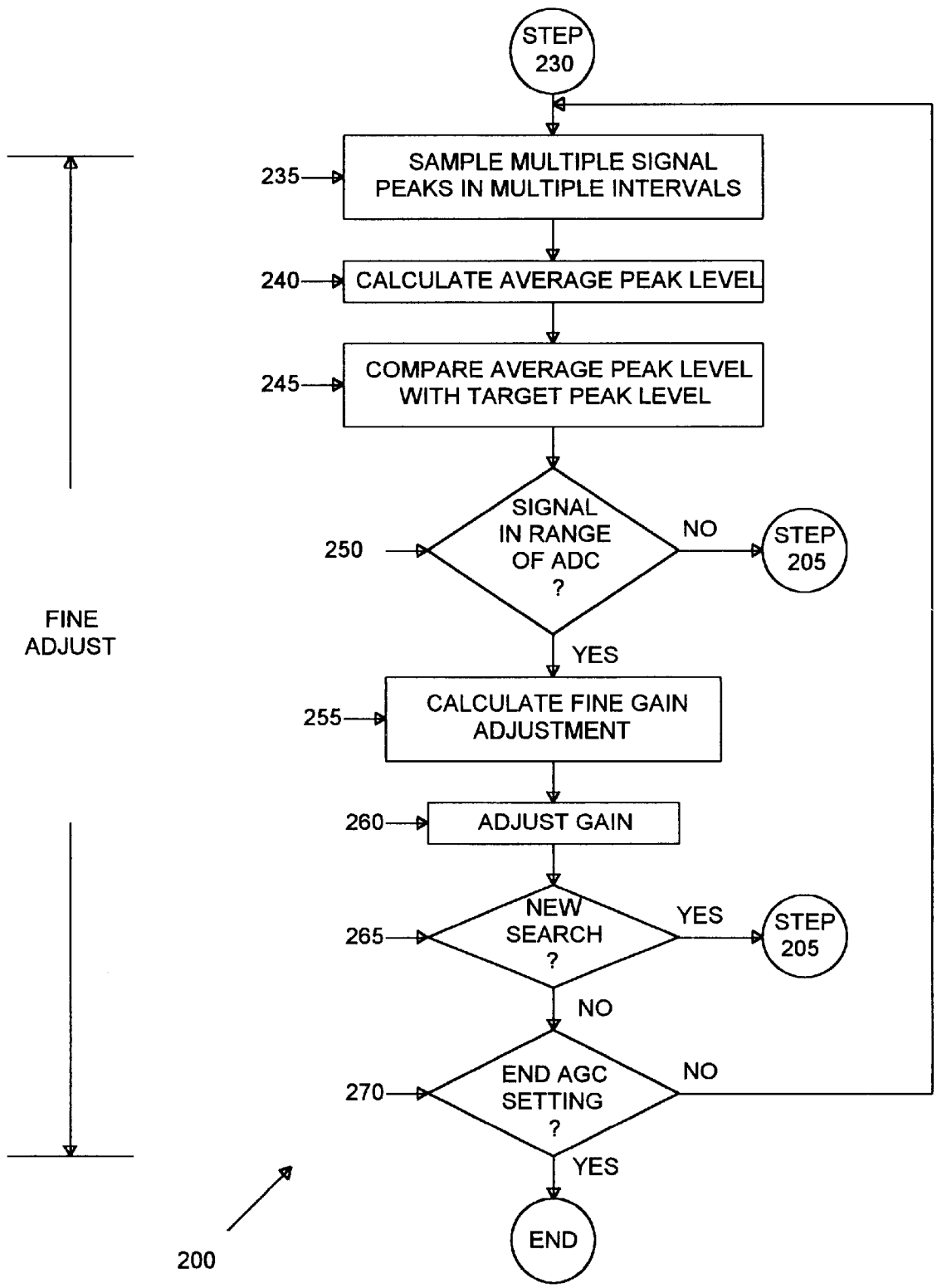

FIGS. 2A–2B depict flow diagram 200 of an algorithm for controlling the automatic gain control circuit according to the present invention. The method steps in FIG. 2A are used to adjust the gain level of automatic gain control circuit 110 to a coarse approximate. The method steps in FIG. 2B are then used to further adjust the gain level of VGA 110 to a more accurate approximate of the target level.

The first stage of the algorithm is a search mode in which the gain of VGA 110 is varied rapidly in order to bring the strength of the amplified signal within the dynamic range of ADC 120. During the search phase, peak detector 132 reads the peak signal level during an initial, relatively short time interval using a peak-hold function (Step 205). The sampled peak signal is then read by analyzer 134, which determines whether the peak signal is within the dynamic range of ADC 120 (Step 210). If too much gain is applied, ADC 120 will be driven to its upper limit (saturation). If insufficient gain is supplied, ADC 120 will be at its lower limit (i.e., zero signal energy output). If the peak signal is within the dynamic range of ADC 120 (i.e., some output value between the upper and lower limits), AGC 130 makes a coarse adjustment of the gain control signal of VGA 110 in order to set the output of VGA 110 to approximately the target peak level (Steps 220 et seq.). This coarse adjustment will be explained below in greater detail.

If the sampled peak signal level initially read by peak detector 132 is not within the dynamic range of ADC 120, AGC 130 adjusts the gain control signal of VGA 110 according to an established search algorithm (Step 215). The process of sampling the signal peak level using a peak-hold function, determining if it is within the dynamic range of ADC 120, and adjusting gain according to the search algorithm if it is not, is repeated until the peak signal level is within the operating range of ADC 120 (i.e., loop through Steps 205, 210 and 215).

There are numerous search algorithms known in the art for adjusting the amplification of an unknown input signal to within the output operating range of an electronic device. One of the best known, but relatively slow, search methods is bisection. In the bisection method, an initial gain range having a maximum gain and a minimum gain is established in which it is known the measured signal must be found (e.g., zero gain setting and maximum gain setting). The gain range is then bisected and the gain level of the device is set to the midpoint value of the initial range. The output of the device is sampled to determine whether or not the received signal has been amplified to within the dynamic range of the output of the device.

If the gain level at the midpoint of the initial range is still too small, the midpoint is redesignated as the new minimum gain value of the range. If, however, the midpoint of the initial range is too great, such that the device is driven to saturation by the received signal, then the midpoint of the range is redesignated as the maximum gain value of the range. The process is repeated, so that the gain is readjusted to the new midpoint of the new gain range, which has a redesignated maximum or minimum gain value according to the results of the first sampling. Subsequent iterations according to the bisection method will continually cut in half the remaining gain interval until the amplified received signal finally falls within the dynamic range of the output of the device.

Figure 3:
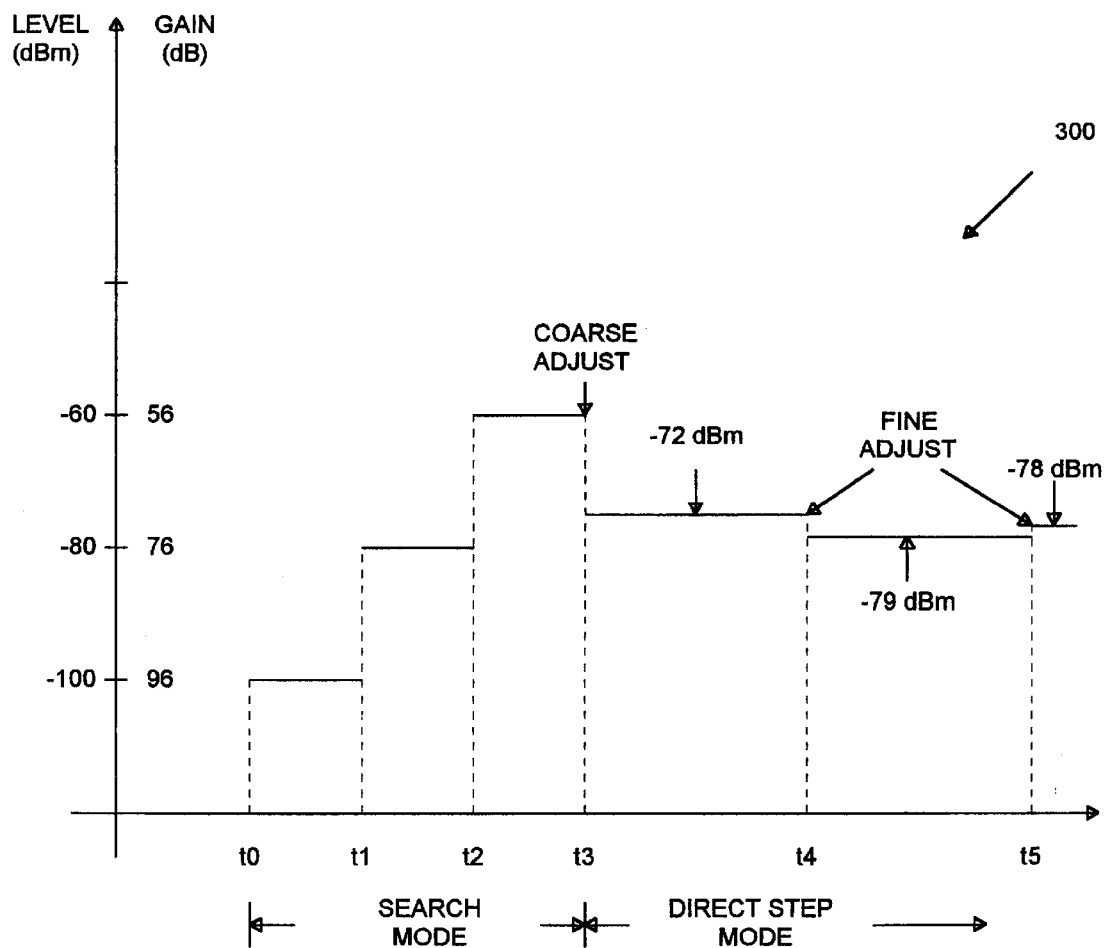
FIG. 3 is a graph illustrating the values of gain setting over time as an AGC in accordance with a first embodiment of the present invention adjusts the gain of an RF receiver.

Other search algorithms are also known, including the search algorithm depicted in FIG. 3. FIG. 3 depicts a search algorithm which moves through the dynamic range of the analog-to-digital converter in incremental (or decremental) steps equal to the dynamic range of the receiver, in this instance, 20 dB. The search mode ends when the received signal comes within the dynamic range of ADC 120. When peak detector 132 and analyzer 134 determine that a signal peak has been received that is within the range of ADC 120, analyzer 134 compares the sampled signal peak level with an optimum target peak level. The target peak level may be predetermined by control signals received from control circuitry (not shown) coupled to AGC 130.

Since the sampled signal peak level and the target peak level are both known values, processor 135 can calculate the gain adjustment, if any, needed to bring the gain of VGA 110 to approximately the level needed to match the sampled signal peak level to the target peak level. Quite frequently, the gain functions of AGC devices are non-linear functions that prevent processor 135 using a simple formula to calculate the necessary gain adjustments. Therefore, in one embodiment of the present invention, AGC 130 includes a look-up table that contains the stored gain function of VGA 110. Processor 135 uses the look-up table to translate the difference between the target peak level and the sampled signal peak level into a control signal that adjusts the gain of VGA 110.

The algorithm starts with a coarse adjustment to set the gain level to approximately the necessary value to adjust the sampled signal peak level to the target peak level (Steps 220, 225, and 230). Then, a more accurate measurement of multiple peak levels is performed and the average peak level is used in the next stage of adjustment. (Steps 235 et seq.).

After the initial gain adjustment is made, peak detector 132 samples multiple signal peak levels over a long interval (Step 235). The long interval is comprised of two or more sampling intervals of length T. Processor 135 calculates the average peak level of the multiple signal peaks sampled during the multiple intervals and compares the average peak level to the target peak level (Steps 240 and 245). In a preferred embodiment, analyzer 134 continually examines the sampled peak levels to ensure that the amplified received signal is still within the dynamic range of ADC 120 (Step 250). This allows the invention to detect the sudden disappearance of the received signal or a sudden increase in received signal strength. In such a case, the present invention branches back to the search mode to again position the amplified received signal within the dynamic range of ADC 120.

Assuming that the amplified received signal is still within the dynamic range of ADC 120, processor 135 calculates a fine gain adjustment (Step 255) and sends a new gain value to gain control 136, which adjusts the gain of AGC 130 accordingly (Step 260). The result of the fine gain adjustment is to bring the average peak level very close to the target peak level. Thereafter, AGC 130 may repetitively calculate average peak levels in order to continually make fine adjustments to the gain control voltage of VGA 110. This repetitive loop may be interrupted if RF receiver 100 initiates a new search (Step 265) or ends the AGC setting process in order to begin receiving data (Step 270).

Graph 300 of FIG. 3 illustrates the values of gain setting over time as an AGC in accordance with a first embodiment of the present invention adjusts the gain of an RF receiver. In FIG. 3, AGC 130 searches for the final gain setting necessary to amplify an input baseband signal having a signal level of −78 dBm to the target signal level in the output dynamic range of ADC 120. The gain values in the graph should be interpreted to mean that gain values of up to 20 dB lower than the indicated level will be detected by AGC 130.

Initially, gain is set at a very high value (for example, 96 dB). This drives ADC 120 into saturation. Peak detector 132 and analyzer 134 determine that the signal level sampled in the time interval from $t_0$ to $t_1$ is not within the dynamic range of ADC 120 and gain is adjusted by a 20 dB decrement (to 76 dB). The peak signal level is again sampled in the time interval from $t_1$ to $t_2$. Peak detector 132 and analyzer 134 again determine that the sampled signal peak level is not within the dynamic range of ADC 120, the gain level is again decremented by 20 dB, and the peak signal level is again sampled in the interval from $t_2$ to $t_3$. In an exemplary digital design, the intervals between $t_0$, $t_1$, $t_2$ and $t_3$ are fixed length intervals of a minimum size, for example 20 $\mu$sec.

The sampled signal peak level in the interval from $t_2$ to $t_3$ indicates that the amplified received signal is finally within the dynamic range of ADC 120. The search mode now ends and a direct step mode begins. The difference between the sampled signal peak level and the target peak level (−78 dBm) is determined and an initial coarse gain adjustment is made at the end of the interval from $t_2$ to $t_3$. As noted above, a look-up table may be used to calculate the necessary gain adjustment, particularly where AGC gain is a non-linear monotone function. In the example, the coarse adjustment sets the gain to about the level of, for example, a −72 dBm signal. Next, multiple peaks are sampled in the prolonged time interval from $t_3$ to $t_4$. The prolonged time interval from $t_3$ to $t_4$ may be comprised of two or more of the minimum length subintervals of length, T. For example, four 20 $\mu$sec. subintervals may be used to sample four peak signal levels (all intervals in FIG. 3 are not necessarily drawn to scale). Averaging the four peaks gives a better value of peak signal strength than using the single largest peak from the four intervals, since the single largest value may be an extraneous noise spike.

The fine gain adjustment is calculated and set by AGC 130. In the example, the fine adjustment sets the gain to about the level of −79 dBm signal. If necessary, additional long interval measurements may be repeated in the interval from $t_4$ to $t_5$ (and thereafter) for verification and to adjust the gain setting more closely to the target level needed for a −78 dBm signal. The gain signal is continually adjusted, until interrupted, to compensate for rounding errors, small fluctuations of the input signal (tracking), and for mismatch between the VGA gain function stored in the look-up table and the true VGA gain function.

A key feature of the present invention is the use of an average of multiple peaks to perform fine gain adjustments. Since the peak hold circuit used for sampling will capture the largest signal occurring in a given time interval, a large noise spike or an unusually large fluctuation in the received signal will give an inaccurate reading with which to adjust gain. This is not a problem in the search mode, where the output of ADC 120 only needs to be a non-zero signal strength that is less than saturation, thereby indicating that the received signal is somewhere in the dynamic range of ADC 120. Hence, a single sample of peak signal strength may be used to determine that the received signal is in the dynamic range of ADC 120 and that the search mode must end. But, in the direct step mode, multiple samples are read and then averaged in order to minimize (or spread) the effect of a large noise spike or a large signal fluctuation occurring in any one of the sampling intervals. In view of this, the length of time between gain adjustments in the search mode may be the same length as or even longer than the period between gain adjustments in the direct step mode. However, the gain adjustments in the direct step mode are based on an average of multiple peak values, rather than on a single peak value, regardless of the length of time between gain adjustments.

It should be noted that the target peak level is not necessarily the full scale dynamic range of ADC 120. For example, the target peak level may be set to 90% of the full dynamic range. This margin is normally built into the algorithm to account for infrequent spikes in signal energy levels that may occur.

It should also be noted that the accuracy of a linearly quantized analog-to-digital converter such as ADC 120 decreases as the sampled peak level diverges from the target peak level. For example, when the signal strength of the sampled peak level is close to the extreme lower limit (i.e, near zero) of the dynamic range of ADC 120, the bit resolution of ADC 120 may be insufficient to give an accurate measurement of the value of signal peak level. This hardware limitation affects the accuracy with which the needed gain adjustment can be calculated. Therefore, in one embodiment of the present invention, a shortened sampling interval is used immediately after the coarse adjustment in order to verify the latest gain setting, as illustrated in FIG. 4.

Figure 4:
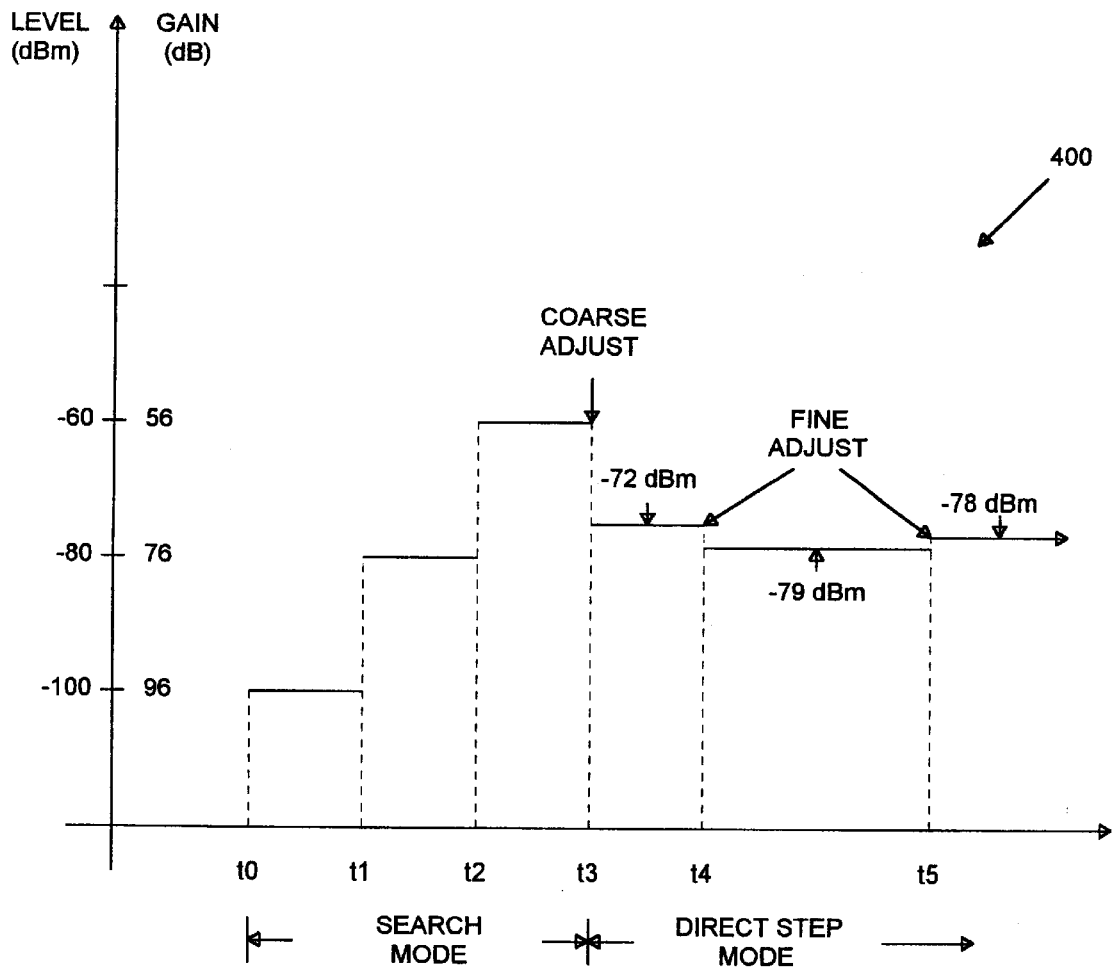
FIG. 4 is a graph illustrating the values of gain setting over time as an AGC in accordance with a second embodiment of the present invention adjusts the gain of an RF receiver.

Graph 400 of FIG. 4 illustrates the values of gain setting over time as an AGC in accordance with a second embodiment of the present invention adjusts the gain of an RF receiver. Graph 400 is similar to graph 3 in most respect, except for the sampling interval immediately following the coarse adjustment. When the sampled signal peak level in the interval from $t_2$ to $t_3$ indicates that the amplified received signal is finally within the dynamic range of ADC 120, the search mode ends, as before, and a modified direct step mode begins.

After an initial coarse gain adjustment is made at the end of the interval from $t_2$ to $t_3$, the improved AGC may verify this latest gain setting during a shortened interval from $t_3$ to $t_4$. The shortened interval from $t_3$ to $t_4$ may be equal to the length of the intervals used in the search mode or may be in between the length of the intervals used in the search mode and the longer intervals used in the rest of the direct step mode. For example, two 20 $\mu$sec. subintervals may be used to sample two peak signal levels (all intervals in FIG. 4 are not necessarily drawn to scale) in the interval from $t_3$ to $t_4$. These two peaks may then be averaged to verify the accuracy of the coarse gain adjustment and the gain is adjusted accordingly at $t_4$. This initial shortened interval at the start of the direct step mode brings AGC gain to a final accurate setting more rapidly.

Although the present invention and its advantages have been described in detail, those skilled in the art should understand that they can make various changes, substitutions and alterations herein without departing from the spirit and scope of the invention in its broadest form.

What is claimed is:

1. For use in an automatic gain control that receives a digital signal from a digital circuit having a given dynamic range and develops therefrom a gain signal to be applied to a variable gain amplifier, an analyzing circuit for determining a magnitude of said gain signal, comprising:

a peak sampling subcircuit that samples peak values of said digital signal over variable length sampling periods; and a gain signal adjustment subcircuit, coupled to said peak sampling subcircuit, that operates in a selected one of:

a search mode in which said gain signal adjustment subcircuit adjusts said variable length sampling periods to a first interval length and adjusts said gain signal at a first rate until a first one of said sampled peak values falls within said dynamic range of said digital circuit; and a direct step mode in which said gain signal adjustment subcircuit adjusts said variable length sampling periods to a second interval length and adjusts said gain signal at a second rate as a function of a deviation of an average of a plurality of sampled peak values from a target average peak value, said analyzing circuit thereby applying a two-stage gain determination process to said digital signal to approach said target average peak value.

2. The analyzing circuit as recited in claim 1 wherein, in said search mode, said gain signal adjustment subcircuit adjusts said gain signal as a function of said dynamic range of said digital circuit.

3. The analyzing circuit as recited in claim 1 wherein, in said search mode, said gain signal adjustment subcircuit adjusts said gain signal by increasing said gain signal by a given amount until said sampled peak value rises above or within said dynamic range of said digital circuit, said gain signal adjustment subcircuit then decreasing said gain signal by a fraction of said given amount to cause said sampled peak value to fall within said dynamic range.

4. The analyzing circuit as recited in claim 1 wherein, in said direct step mode, said gain signal adjustment subcircuit adjusts said second interval length to encompass a varying number of sampled peak values of said digital signal.

5. The analyzing circuit as recited in claim 1 wherein, in said direct step mode, said gain signal adjustment subcircuit adjusts said gain signal according to a monotone function representing a gain function of said variable gain amplifier.

6. The analyzing circuit as recited in claim 1 wherein, in said direct step mode, said gain signal adjustment subcircuit adjusts said gain signal according to a gain function of said variable gain amplifier stored in a look-up table associated with said analyzing circuit.

7. The analyzing circuit as recited in claim 6 wherein, in said direct step mode, said gain signal adjustment subcircuit continually adjusts said gain signal to compensate for a mismatch of said gain function stored in said look-up table and an actual gain function of said variable gain amplifier.

8. The analyzing circuit as recited in claim 1 wherein, in said direct step mode, said gain signal adjustment subcircuit continually adjusts said gain signal to compensate for rounding errors.

9. The analyzing circuit as recited in claim 1 wherein, in said direct step mode, said gain signal adjustment subcircuit continually adjusts said gain signal to compensate for small signal fluctuations.

10. For use in an automatic gain control that receives a digital signal from a digital circuit having a given dynamic range and develops therefrom a gain signal to be applied to a variable gain amplifier, a method of determining a magnitude of said gain signal, comprising the steps of:

sampling peak values of said digital signal during each of at least one variable length period of time; and operating a gain signal adjustment subcircuit in a selected one of:

a search mode in which said gain signal adjustment subcircuit adjusts said vaiable periods of time to a first interval length and adjusts said gain signal at a first rate until a first one of said sampled peak values falls within said dynamic range of said digital circuit; and a direct step mode in which said gain signal adjustment subcircuit adjusts said variable periods of time to a second interval length and adjusts said gain signal at a second rate as a function of a deviation of an average of a plurality of sampled peak values from a target average peak value, said analyzing circuit thereby applying a two-stage gain determination process to said digital signal to approach said target average peak value.

11. The method as recited in claim 10 wherein, in said search mode, said gain signal adjustment subcircuit performs the step of adjusting said gain signal as a function of said dynamic range of said digital circuit.

12. The method as recited in claim 10 wherein, in said search mode, said gain signal adjustment subcircuit performs the step of adjusting said gain signal by increasing said gain signal by a given amount until said sampled peak value rises above said dynamic range of said digital circuit, then decreasing said gain signal by said fraction of said given amount to cause said sampled peak value to fall within said dynamic range.

13. The method as recited in claim 10 wherein, in said direct step mode, said gain signal adjustment subcircuit performs the step of adjusting said second interval length to encompass a varying number of sampled peak values of said digital signal.

14. The method as recited in claim 10 wherein, in said direct step mode, said gain signal adjustment subcircuit performs the step of adjusting said gain signal according to a monotone function representing a gain function of said variable gain amplifier.

15. The method as recited in claim 10 wherein, in said direct step mode, said gain signal adjustment subcircuit performs the step of adjusting said gain signal according to a gain function of said variable gain amplifier stored in a look-up table associated with said analyzing circuit.

16. The method as recited in claim 15 wherein, in said direct step mode, said gain signal adjustment subcircuit performs the step of continually adjusting said gain signal to compensate for a mismatch of said gain function in said look-up table and an actual gain function of said variable gain amplifier.

17. The method as recited in claim 10 wherein, in said direct step mode, said gain signal adjustment subcircuit performs the step of continually adjusting said gain signal to compensate for rounding errors.

18. The method as recited in claim 10 wherein, in said direct step mode, said gain signal adjustment subcircuit performs the step of continually adjusting said gain signal to compensate for small signal fluctuations.

19. A digital radio receiver, comprising:

a power supply;

a radio signal reception circuit, coupled to said power supply, that receives radio signals;

a demodulation circuit, coupled to said radio signal reception circuit, that removes a carrier wave from said radio signals to yield a modulating wave;

a variable gain amplifier, coupled to said demodulation circuit, that amplifies said modulating wave as a function of a gain signal received into said variable gain amplifier to produce an amplified modulating wave;

an analog to digital converter, coupled to said variable gain amplifier and having a given dynamic range, that quantizes said amplified modulating wave to produce a digital signal; and an automatic gain control, coupled to said analog to digital converter, that receives said digital signal and develops therefrom a gain signal to be applied to said variable gain amplifier, said automatic gain control having an analyzing circuit for determining a magnitude of said gain signal, including:

a peak sampling subcircuit that samples peak values of said digital signal over variable periods of time; and a gain signal adjustment subcircuit, coupled to said peak sampling subcircuit, that operates in a selected one of:

a search mode in which said gain signal adjustment subcircuit adjusts said variable periods of time to a first interval length and adjusts said gain signal at a first rate until a first one of said sampled peak values falls within said dynamic range of said analog to digital converter; and a direct step mode in which said gain signal adjustment subcircuit adjusts said variable periods of time to a second interval length and adjusts said gain signal at a second rate as a function of a deviation of an average of a plurality of said sampled peak values from a target average peak value, said analyzing circuit thereby applying a two-stage gain determination process to said digital signal to approach said target average peak value.

20. The digital radio receiver as recited in claim 19 wherein, in said search mode, said gain signal adjustment subcircuit adjusts said gain signal as a function of said dynamic range of said analog to digital converter.

21. The digital radio receiver as recited in claim 19 wherein, in said search mode, said gain signal adjustment subcircuit adjusts said gain signal by increasing said gain signal by a given amount until said sampled peak value rises above said dynamic range of said analog to digital converter, said gain signal adjustment subcircuit then decreasing said gain signal by a fraction of said given amount to cause said sammpled peak value to fall within said dynamic range.

22. The digital radio receiver as recited in claim 19 wherein, in said direct step mode, said gain signal adjustment subcircuit adjusts said second interval length to encompass a varying number of sampled peak values of said digital signal.

23. The digital radio receiver as recited in claim 19 wherein, in said direct step mode, said gain signal adjustment subcircuit adjusts said gain signal according to a monotone function representing a gain function of said variable gain amplifier.

24. The digital radio receiver as recited in claim 19 wherein, in said direct step mode, said gain signal adjustment subcircuit adjusts said gain signal according to a gain function of said variable gain amplifier stored in a look-up table associated with said analyzing circuit.

25. The digital radio receiver as recited in claim 24 wherein, in said direct step mode, said gain signal adjustment subcircuit continually adjusts said gain signal to compensate for a mismatch of said gain function stored in said look-up table and an actual gain function of said variable gain amplifier.

26. The digital radio receiver as recited in claim 19 wherein, in said direct step mode, said gain signal adjustment subcircuit continually adjusts said gain signal to compensate for rounding errors.

27. The digital radio receiver as recited in claim 19 wherein, in said direct step mode, said gain signal adjustment subcircuit continually adjusts said gain signal to compensate for small signal fluctuations.

* * * * *